United States Patent
Koller et al.

(10) Patent No.: US 10,658,201 B2
(45) Date of Patent: May 19, 2020

(54) CARRIER SUBSTRATE FOR A SEMICONDUCTOR DEVICE AND A METHOD FOR FORMING A CARRIER SUBSTRATE FOR A SEMICONDUCTOR DEVICE

(71) Applicant: Intel IP Corporation, Santa Clara, CA (US)

(72) Inventors: Sonja Koller, Regensburg (DE); Georg Seidemann, Landshut (DE); Bernd Waidhas, Pettendorf (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/935,128

(22) Filed: Mar. 26, 2018

(65) Prior Publication Data
US 2019/0295857 A1    Sep. 26, 2019

(51) Int. Cl.
*H01L 23/48*    (2006.01)
*H01L 21/48*    (2006.01)
*H01L 23/498*   (2006.01)

(52) U.S. Cl.
CPC ...... *H01L 21/486* (2013.01); *H01L 23/49827* (2013.01); *H01L 23/49866* (2013.01)

(58) Field of Classification Search
CPC .................................................... H01L 21/486
USPC ......................................................... 257/773
See application file for complete search history.

(56) References Cited

U.S. PATENT DOCUMENTS

| | | | |
|---|---|---|---|
| 2009/0191358 A1* | 7/2009 | Perelaer | H01L 21/288 427/557 |
| 2017/0125332 A1* | 5/2017 | Song | H01L 23/49827 |
| 2017/0178946 A1* | 6/2017 | Zenou | H05K 3/02 |
| 2018/0114703 A1* | 4/2018 | Karni | H05K 3/245 |

OTHER PUBLICATIONS

Wikipedia: "Anisotropic conductive film" https://en.wikipedia.org/wiki/Anisotropic_conductive_film.
John Vivari et al: "Laser Solder Reflow: A Process Solution", Laser Soler Reflow: A Process Solution, 2007.
Nitin Shankar: "Micromachining at Laser World of Photonics", http://www.industrial-lasers.com/articles/2015/07/micromachining-at-laser-world-of-photonics.html, Jul. 14, 2015.

* cited by examiner

*Primary Examiner* — Ajay Arora
(74) *Attorney, Agent, or Firm* — 2SPL Patent Attorneys PartG mbB; Kieran O'Leary (57) ABSTRACT

A method for forming a carrier substrate for a semiconductor device, the method includes providing a substrate layer including conductive particles embedded in an electrically insulating material and localized heating of the substrate layer along a desired trace by a laser to form a conductive trace of merged particles along the desired trace.

19 Claims, 6 Drawing Sheets

CARRIER SUBSTRATE FOR A SEMICONDUCTOR DEVICE AND A METHOD FOR FORMING A CARRIER SUBSTRATE FOR A SEMICONDUCTOR DEVICE

FIELD

Examples relate to semiconductor technologies, and in particular, to a carrier substrate for a semiconductor device and a method for forming a carrier substrate for a semiconductor device.

BACKGROUND

Lithographic processes may be used to manufacture electrical connections on a circuit board or a semiconductor package substrate to enable electrical connections between different components. It may be desired to reduce the costs, the complexity or the manufacturing time of circuit boards or package substrates or increase the flexibility of the wiring of circuit boards or package substrates.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices may be embedded in packages to provide protection against impact and corrosion, to hold the contact pins or leads and/or to dissipate heat produced by the device, for example. A semiconductor package may include one or more semiconductor components. Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package may protect the semiconductor die against the ingress of moisture, for example. Similarly, non-semiconductor electrical components (e.g. resistors, capacitors, inductors) may be arranged in packages.

A semiconductor package may comprise a package substrate with embedded conductive traces in order to carry a semiconductor die and to connect the contact pads of the semiconductor die (e.g. small pads at high areal density) to contact interfaces (e.g. solder balls or contact pads at lower areal density) of the semiconductor package.

The semiconductor package or a bare semiconductor die may be attached to a circuit board (e.g. printed circuit board, PCB). The circuit board may comprise embedded conductive traces to connect contact interfaces (e.g. solder balls or contact pads) of the semiconductor package or the semiconductor die to other electrical components on the circuit board.

Figure 1:
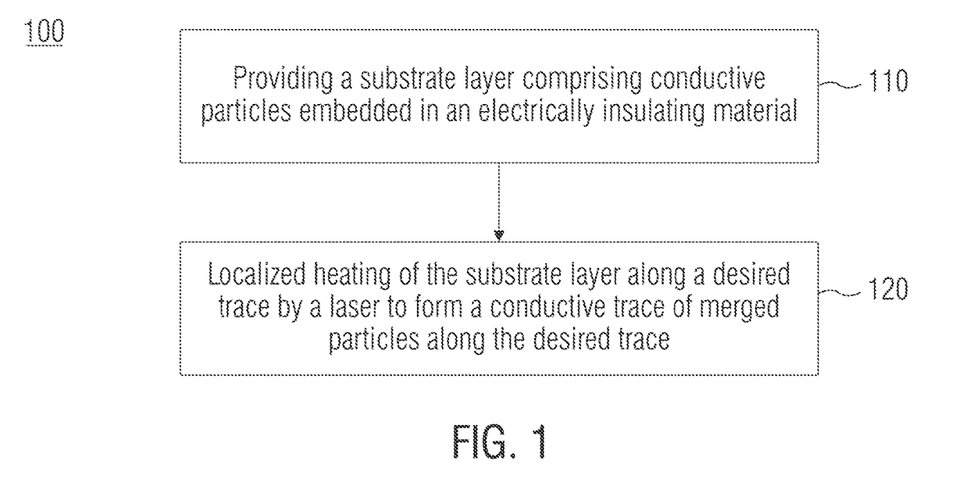
FIG. 1 shows a flowchart of a method for forming a carrier substrate.

FIG. 1 shows a flowchart of a method 100 for forming a carrier substrate for a semiconductor device. The method 100 comprises providing 110 a substrate layer comprising conductive particles embedded in an electrically insulating material. The method 100 further comprises localized heating 120 of the substrate layer along a desired trace by a laser to form a conductive trace of merged particles along the desired trace.

Due to the localized heating 120 of the substrate layer along a desired trace by a laser to form a conductive trace of merged particles, conductive traces may be written directly into the substrate reducing the necessary equipment and complexity of forming conductive traces. Laser writing also allows for reprocessing of the substrate, in order to add traces, for example.

The electrically insulating material may comprise or consist of mold, mold compound, gel type contents, resin (such as epoxy resin, acrylic resin, phenolic resin and/or polyester resin), and/or similar materials. Within the insulating material, conductive particles are embedded or suspended.

The electrically conductive particles may be, may comprise, or may consist of solder, tin particles, tin alloy particles, lead particles, lead alloy particles, nickel particles, nickel alloy particles, copper particles, copper alloy particles, silver particles, silver alloy particles, aluminum particles, aluminum alloy particles, gold particles, gold alloy particles, and/or any combination thereof. Depending on the materials chosen, appropriate melting and/or curing conditions may vary (for example, the heat or pressure necessary to merge the conductive particles together). An average size of the embedded conductive particles may be greater than 1 μm (or greater than 5 μm) and/or less than 50 μm (or less than 20 μm). The average size of the embedded particles may be determined by averaging over the individual sizes of the embedded particles.

An average density of the embedded conductive particles may be greater than $1*10^4$ particles per $mm^3$ (or greater than $2\times10^4$ particles per $mm^3$) and/or less than $2\times10^9$ particles per $mm^3$ (or less than $1*10^9$ particles per $mm^3$). The average density of the embedded conductive particles may be determined by averaging over the whole substrate layer or a portion of the substrate layer embedding the conductive particles (e.g. if the conductive particles are not distributed over the whole substrate layer). In other words, in a substrate with a nonhomogeneous conductive particle density, the average density may be determined by averaging over the regions of the substrate layer where a conductive trace is to be formed; conversely, regions in the substrate where no traces will be formed may be excluded. Such empty (or low density) regions may be desired in order to, for example, let RF signals pass through without much loss or interference. The volumetric share of the embedded conductive particles in the substrate layer may be greater than 70% (or greater than 80%) and/or less than 95% (or less than 90%). The volumetric share may be determined by dividing the volume of the embedded conductive particles by the volume of the insulating material containing said particles.

An average distance from center-to-center of the embedded conductive particles may be greater than 1× (or 1.1× or 1.2×) of the average particle diameter and/or less than 2× (or 1.9× or 1.8×) the average particle diameter. The average distance between the boundaries of the particles may be greater than 0 (or greater than ⅒ the average particle diameter) and/or less than an average particle diameter (or less than half a particle diameter). In other words, the particles may almost touch each other while being separated from each other by only a thin layer of isolating material. The average distance between the embedded conductive particles may be determined by averaging over the individual distance of each particle to the closest neighboring particle. The particle material, the average particle size, the average particle density and/or the average particle distance may be selected so that particles are merged when locally heated by the laser to form a conductive trace.

The laser beam's focus may be moved along (or refocused within) the substrate layer corresponding to the path of the desired trace to be formed. By generating at least sufficient heat along the desired trace, the conductive particles and the electrically insulating material melt along the desired trace and the electrically conductive particles merge to form the electrically conductive trace. The desired trace may be a predefined path at the surface or within the substrate layer and defines the part of substrate layer where a conductive line should be formed. The conductive trace may be formed along a surface of the substrate layer, or, with an appropriate focus of the laser, a conductive trace may be written into the depth of the substrate layer. By using a combination of the laser beam's focus along and within the substrate, 3D conductive traces may be formed directly into the substrate layer. In this way, conductive traces may be formed within the substrate layer without the need for etching or other equipment.

A suitable laser may have wavelengths longer than 750 nm and/or shorter than 1 mm (or shorter than 1400 nm). In other words, the laser may emit light with a maximal emission intensity (e.g. maximum of emitted spectrum) at a wavelength of more than 750 nm and/or less than 1 mm. The wavelength of the laser may be selected depending on the electrically insulating material of the substrate layer and the material of the conductive particles. The laser may be an infrared laser. For example, the laser may be in the near infrared spectrum, with wavelengths shorter than 1.4 μm and/or longer than 0.75 μm. For example, a high power diode laser. For example, wavelengths in the near infrared spectrum are less reflected by metallic materials and less absorbed in organic materials. This means the energy may be mainly get deposited into the conductive particles and not in the surrounding dielectric or insulating material. With a suitable laser, overheating or burning of the insulating material may be avoided. Thus, wavelengths within an appropriate range may prevent damage of the surrounding insulating material, reduce heat dissipation, and minimize wasted energy.

A laser emitting pulses longer than 1 femtosecond ($10^{-15}$ seconds) and/or shorter than 1 picosecond ($10^{-12}$ seconds) may be used. Ultrafast lasers emit picosecond or femtosecond pulses which are shorter than the time needed for most energy diffusion processes within the atomic lattice (e.g. a direct phase transition into the gaseous phase occurs). This means that there is no or only low heat spreading to the surrounding insulating material and that the energy is absorbed by the conductive particles. Thus, in order to further minimize heat spread and/or prevent damage to the surrounding insulating material, the pulses of the laser may be kept short. Additionally, or alternatively, a permanently emitted "cw" (continuous wave) laser or pulse laser in the micro- to nano-second range may be used. Care should be taken that the energy emitted remains sufficiently small such that the material removal is based on the strong heating of the absorbing medium. The temperature of the conductive particles during trace writing should be sufficient to melt or merge the conductive particles together; for example, the temperature may be greater than 100° C. (or greater than 200° C.) and/or less than 400° C. (or less than 300° C.)

For example, the conductive trace forms an electrically conductive line providing a low resistive electrical connection between a first end of the conductive trace and a second end of the conductive trace. The conductive trace may be made primarily of conductors with specific resistivity less than $1*10^{-6}$ Ωm, such as copper (~$2\times10^{-8}$ em), Tin ($1*10^{-7}$ Ωm), Manganese ($1.4\times10^{-6}$ Ωm), and/or silver ($1.6\times10^{-8}$ em). For example, the conductive trace may have a specific resistance of less than $1*10^{-5}$ Ωm (or less than $1*10^{-7}$ Ωm). The conductive particles may comprise a particle size so that the surface roughness of the conductive trace may be greater than 1 µm (or greater than 5 µm) and/or less than 50 µm (or less than 20 µm).

The carrier substrate to be formed may be a package substrate of a semiconductor device or a circuit board for electrically connecting a semiconductor device to other components.

The substrate layer may comprise a thickness of at most 5 mm (or at most 2 mm or at most 1 mm) and/or at least 5 µm (or at least 25 µm or at least 50 µm). The substrate layer may be used to form a single carrier substrate or a plurality of carrier substrates. For example, the substrate layer may comprise a plurality carrier substrates after forming conductive traces for the plurality of carrier substrates. The plurality of carrier substrates implemented at the substrate layer may be separated from each other (e.g. by dicing or sawing) after forming the conductive traces. A length, width or diameter of the substrate layer, or a region in the substrate layer with a sufficiently high density of conductive particles to write conductive traces, may be at least 10 µm (or at least 1 mm or at least 10 mm) and/or at most 1 m (or at most 50 cm or at most 20 cm).

The method of FIG. 1 may further comprise applying pressure greater than $1*10^{-10}$ bar (or greater than $1*10^{-8}$ bar) and/or less than 100 bar (or less than 50 bar) to the substrate layer during the formation of the conductive trace. For example, the pressure applied may be greater than 10 bar (or greater than 20 bar or greater than 30 bar) and/or less than 100 bar (or less than 90 bar or less than 80 bar). Alternatively, it should be appreciated that a reduction in pressure may be used if the process is integrated into a negative pressure system or gas atmosphere. For example, the applied pressure may be greater than $1*10^{-10}$ bar (or greater than $1*10^{-9}$ or greater than $1*10^{-8}$) and/or lower than $1*10^{-1}$ bar (or lower than $1*10^{-2}$ or lower than $1*10^{-3}$); in other words, the applied pressure may be a negative pressure. The pressure applied (or removed) to the substrate may be sufficient to bring the conductive particles closer to each other in order to enable the conductive particles to merge together when heat is applied to them.

In order to apply the desired pressure, the substrate may be inserted into equipment maintaining the desired pressure. The pressure may be a gaseous pressure, applied by increasing the gas pressure of a gas surrounding the substrate layer. Additionally, or alternatively, the pressure may be imparted by other physical principles and/or equipment. For example, a mechanical (physical) pressure or a fluid pressure may be applied instead of, or in addition to, a gaseous pressure.

Optionally, the manufacturing of the conductive trace may be further improved by providing a sharper heating focus along the desired trace or by minimizing heat dispersion throughout the substrate and/or insulating material. This may be accomplished through a variety of means, used independently or in conjunction with each other, such as pre-heating the desired trace and/or cooling the substrate during formation of the conductive trace.

The method 100 may further comprise pre-heating regions of the desired trace to a temperature greater than the ambient temperature (for example, greater than 25° C. or greater than 50° C.) during the formation of the conductive trace. The pre-heating temperature may be less than the melting temperature of the conductive particles and/or less than the temperature at which the insulating material degrades thermally (for example, less than 200° C. or less than 100° C.). The melting temperature of the conductive particles and/or the temperature at which the insulating material degrades may vary depending on the chosen materials. By pre-heating the area of the desired trace, less energy (and thus, less time and less heat dispersion) may be needed to merge the conductive particles into a conductive trace. For example, a temperature being lower than a melting temperature of the conductive particles and the electrically insulating material of the substrate layer is used for pre-heating. Pre-heating may be provided by additional lasers, heat guns, or by heating a carrier of the substrate layer and/or the atmosphere surrounding the substrate layer, for example. Due to the pre-heating, the laser power for the local heating along the desired trace may be kept low.

Additionally, or alternatively, the method may further comprise cooling of the substrate layer such that at least a part of the substrate layer has a temperature less than the ambient temperature (or less than 20° C. or less than 10° C.) and/or greater than the brittleness temperature of the insulating material (e.g. the temperature at which the insulating material becomes brittle and easily breakable; for example greater than −100° C. or greater than −50° C.) during the formation of the conductive trace. Cooling, either of the overall substrate layer or of the non-trace regions, may reduce the overall heat profile and aid in sharpening the trace edges. The non-trace regions refer to any part of the substrate layer that does not lie along the desired trace. Cooling may be provided by cooling a carrier (e.g. a cooling chuck) of the substrate layer and/or the atmosphere surrounding the substrate layer, for example. Due to the cooling, the trace edges may get sharper or manufacturing of smaller conductive traces may be enabled.

If the heating of the trace regions by laser is combined with cooling (overall or just of the non-trace regions), then the heat profile, and with it, the traces edges, may get sharper.

For example pre-heating and/or cooling may be performed during the formation of the conductive trace, or immediately beforehand, such that the effects of the pre-heating and/or cooling are present during the formation of the conductive trace.

The method 100 may further comprise attaching a second substrate layer to the (first) substrate layer. The second substrate layer may comprise conductive particles embedded in an electrically insulating material. The second substrate layer (and any additional layers) may be written by a laser in a manner analogous to the first substrate layer. The method 100 may further comprise localized heating of a second substrate layer along a second desired trace by the laser or another laser to form a second conductive trace of merged particles along the second desired trace.

If the depth (thickness) of the desired substrate layer is greater than the maximum writing depth of the laser, it may be possible to build up a thick substrate using thin layers requiring a low writing depth. One approach may be to write each layer separately and then to attach them together. For example, the separately written layers may be aligned to each other before attaching them. A second approach may be to write a first layer, attach or form a raw (unwritten) second layer on top, and then to write the second layer. Another approach, if the thickness of the desired substrate layer is less than double the maximum writing depth of the laser, may be to write one side (e.g. halfway into the substrate layer), and then to write the second half from the other side.

The substrate layer may be attached to the second substrate layer by application of an anisotropic conductive adhesive or through application of appropriate heat and pressure sufficient to merge or bond the two substrate layers together. If the layers were separately written, the layers may be aligned to each other before attaching the layers together.

In this way, a substrate may be formed that is significantly thicker than the maximum writing depth of the laser.

The method 100 may further comprise forming a contact pad on a part of the conductive trace uncovered at a surface of the substrate layer. The contact pad may be used as contact interface to a semiconductor die and/or for attaching a solder ball or solder bump and/or to solder a semiconductor die to the substrate layer. For example, the conductive trace might not be formed at the surface of the substrate layer and may be covered by the insulating material (for example, when the conductive trace is written within the depth of the substrate layer). In this example, the method 100 may further comprise uncovering a part of the conductive trace by removing a part of the electrically insulating material before forming the contact pad. The electrically insulating material may be removed by, for example, etching or through the use of a different laser of an appropriate wavelength capable of removing the insulating material without merging the conductive particles. Alternatively, the method 100 may further comprise covering a part of the conductive trace and/or insulating material before or during the formation of the contact pad. For example, when the conductive trace is written along the surface of the substrate layer, the conductive trace may not be covered by the electrically insulating material. Electrically insulating material may be added to cover the exposed parts of the conductive trace which will not have a contact pad formed thereon. The electrically insulating material may be added by, for example, deposition. By providing a contact pad on a part of the conductive trace, connections to other electrical components may be enabled.

The method 100 may further comprise electrically connecting a semiconductor die to the conductive trace. This may be accomplished by a direct connection to an exposed part of the conductive trace, or by electrically connecting the semiconductor die to a contact pad that has been formed.

A plurality of conductive traces may be formed in the substrate layer to obtain a redistribution layer of a package substrate or a circuit board, for example.

Figure 2:
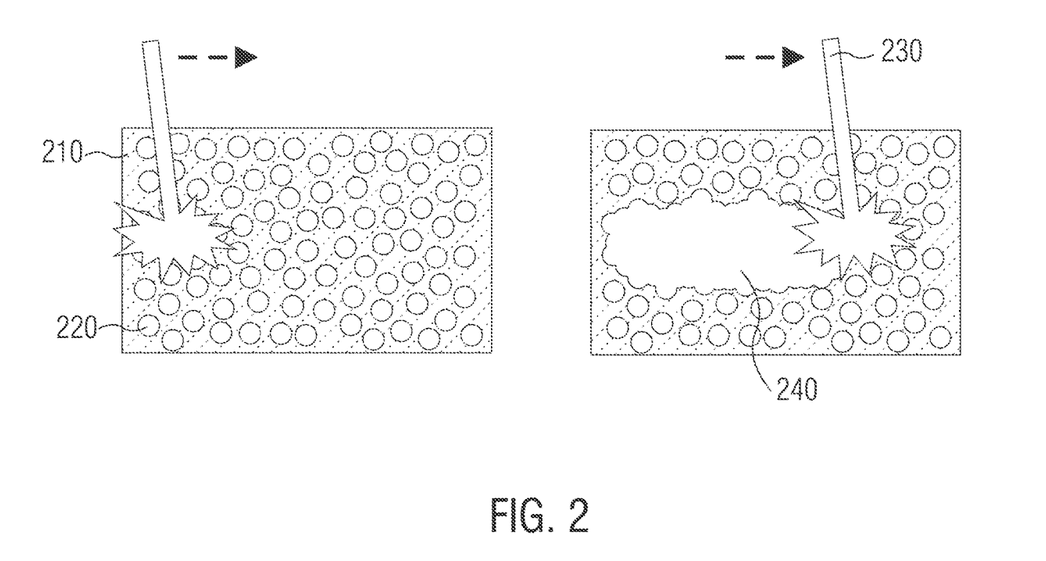
FIG. 2 shows a schematic overview of a method for forming an example carrier substrate.

FIG. 2 shows a schematic cross section of a carrier substrate for a semiconductor device during manufacturing of the carrier substrate according to an example. The implementation of the method for forming the carrier substrate may be similar to the implementation of the method described in connection with the method of FIG. 1. FIG. 2 shows a focused laser beam 230 writing a conductive trace 240 into dielectric material with suspended conductive particles.

The carrier substrate comprises conductive particles 220 embedded in an electrically insulating material layer 210. A focused laser beam 230 moves along a desired trace (direction of arrow) to form a conductive trace 240 of merged conductive particles into the substrate.

FIG. 2 illustrates the writing of a conductive trace by a focused laser beam. An example of a more detailed process flow, including application of pressure, is described in in connection with FIGS. 2A-2E.

Figure 2A:
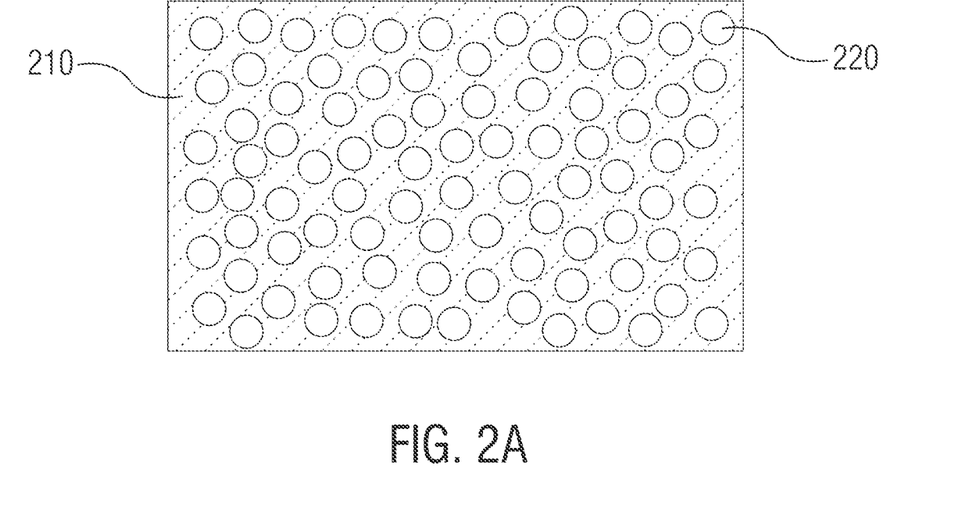
FIGS. 2A-2E show schematic illustrations of a method for forming a carrier substrate.

FIG. 2A shows an electrically insulating material 210 with conductive particles 220 embedded within. A wide choice of particle sizes and heat/pressure curing conditions can be chosen based on the requirements of the trace to be formed (for example, thickness, writing depth, or surface roughness).

Figure 2B:
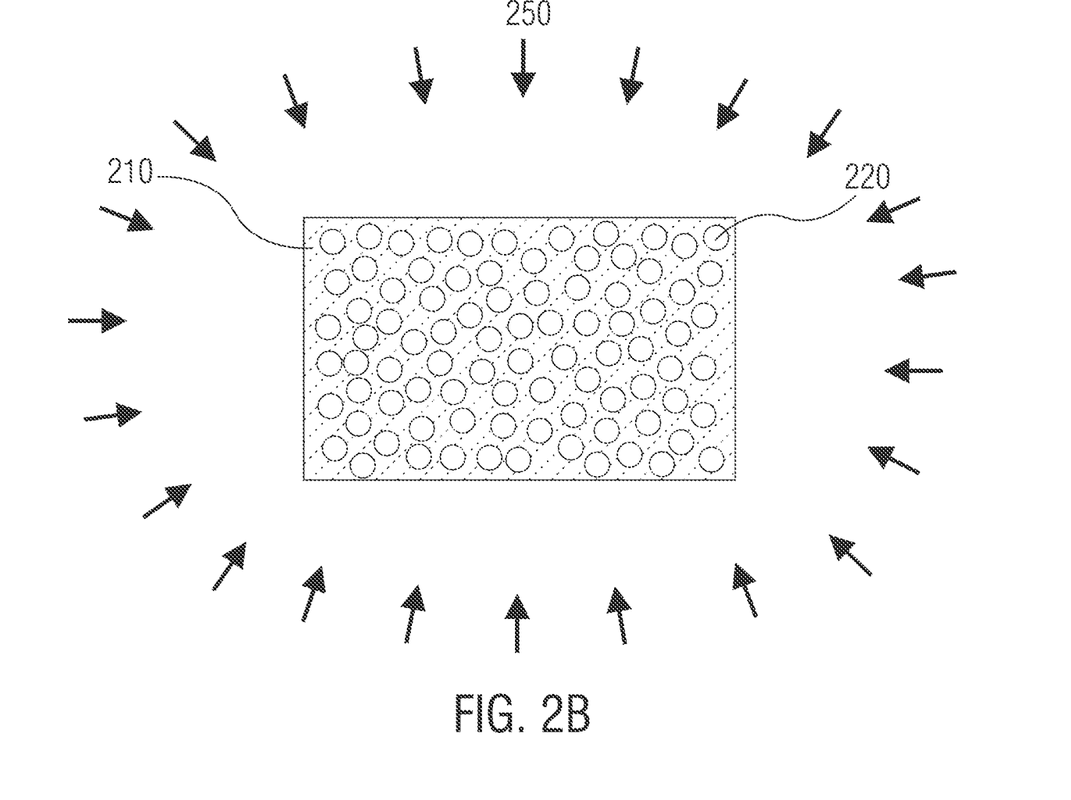

FIG. 2B shows the (optional) application of a pressure 250 to the electrically insulating material 210 and the embedded conductive particles 220. The material may be inserted into equipment maintaining predefined pressure conditions for curing (e.g. for forming the conductive trace). The compression brings the suspended conductive particles closer together.

Figure 2C:
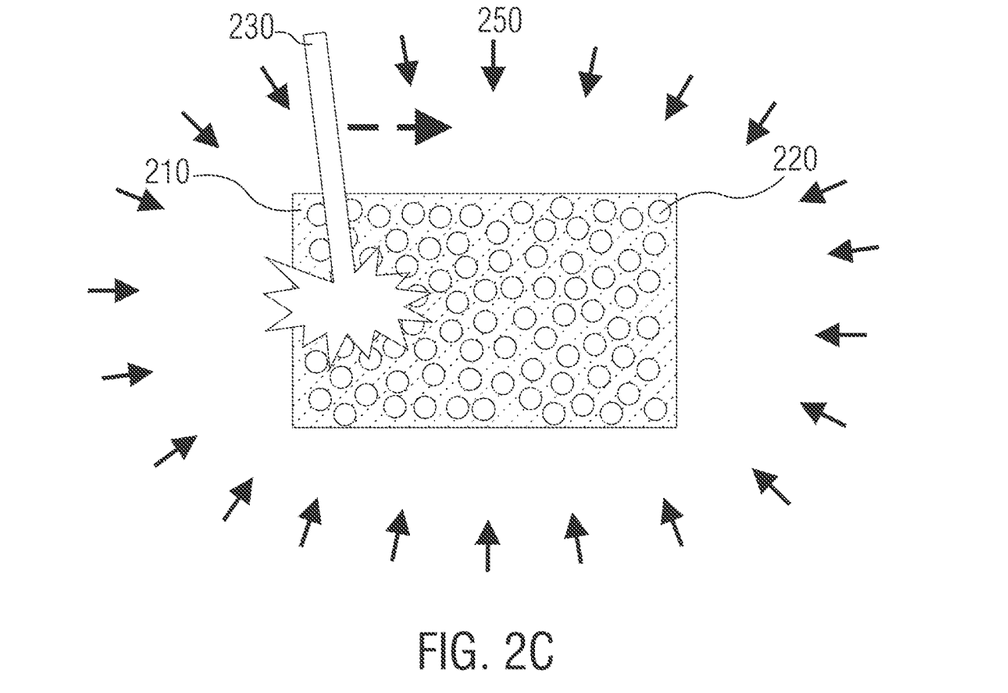

FIG. 2C shows the formation of a conductive trace along a desired trace (direction of arrow) by a laser 230 while the substrate is under pressure 250. A heat condition for curing (merging the conductive particles to form the conductive trace) is generated locally by a focused laser beam 230. A conductive trace is formed by gradual movement of the laser focus along the desired path (direction of arrow).

Short enough pulses and wavelengths of the laser beam prevent damage of the surrounding dielectric material as previously explained. Optionally, pre-heating (of the desired trace) and/or external cooling (of the substrate or non-trace regions) may sharpen the heat profile and the smearing of the traces may be reduced.

Instead of the depicted single laser beam in FIG. 2C, multiple laser beams can be utilized. The use of multiple laser beams may increase the overall process speed, create a sharper heating focus, or allow pre-heating of the adjacent regions into which the laser focus will progress. During formation of the conductive trace, multiple iterations of a laser (or of multiple lasers) going along the desired trace may be used (e.g. for more reliable melting and/or joining of the particles, for smoothness, and/or for broadening the trace).

Figure 2D:
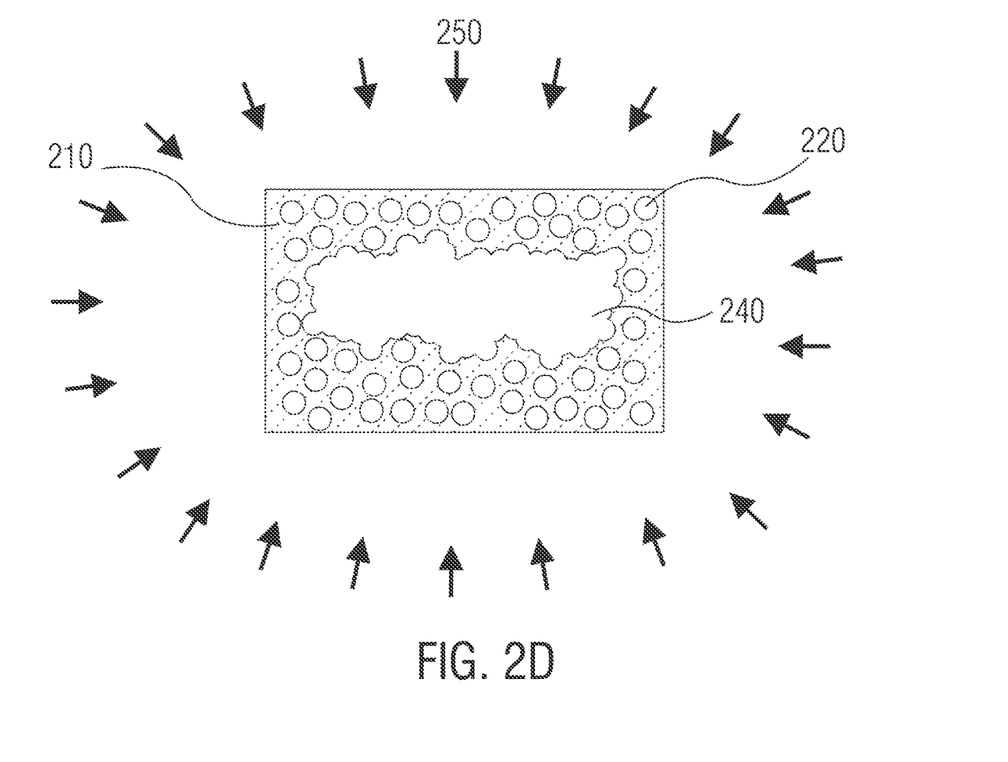

FIG. 2D shows the formed conductive trace 240 after the laser 230 has moved along the desired trace (direction of the arrow in FIG. 2C). Once the writing of the conductive trace 240 is complete, the pressure 250 may be released. The laser writing has formed a conductive trace inside the dielectric material with suspended conductive particles.

Figure 2E:
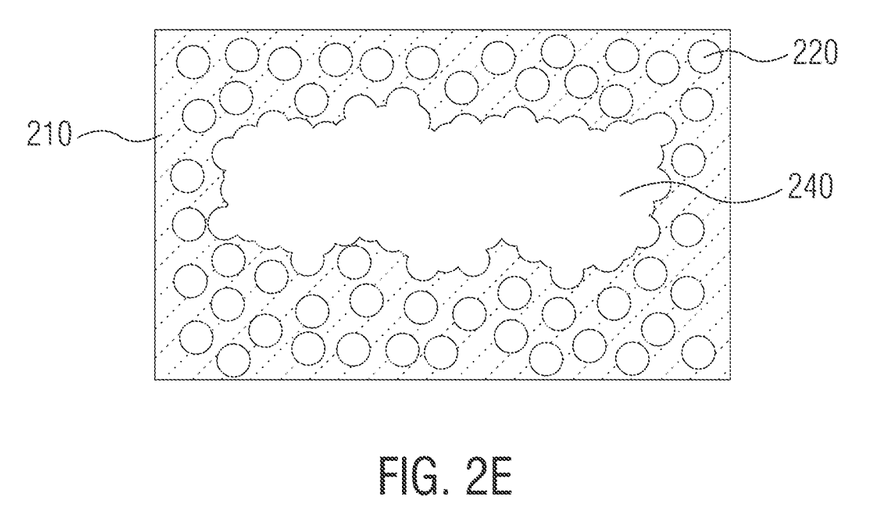

FIG. 2E shows a completed conductive trace 240 once the pressure 250 has been released. After the pressure 250 is released, the dielectric or insulating material 210 between the embedded conductive particles 220 expands, and the spacing between the conductive particles 220 and the conductive trace 240 increases. The conductive trace 240 retains its shape due to the merging of the particles within it.

The method described in connection with FIGS. 2A-2E shows the writing of a single conductive trace. In the same manner, multiple conductive traces or a full RDL (redistribution layer) may be written.

The examples shown in FIG. 2 and FIGS. 2A-2E may comprise one or more optional additional features corresponding to one or more aspects mentioned in connection with the proposed concept or one or more examples described above (e.g. FIG. 1) or below (e.g. FIGS. 3-7).

Figure 3:
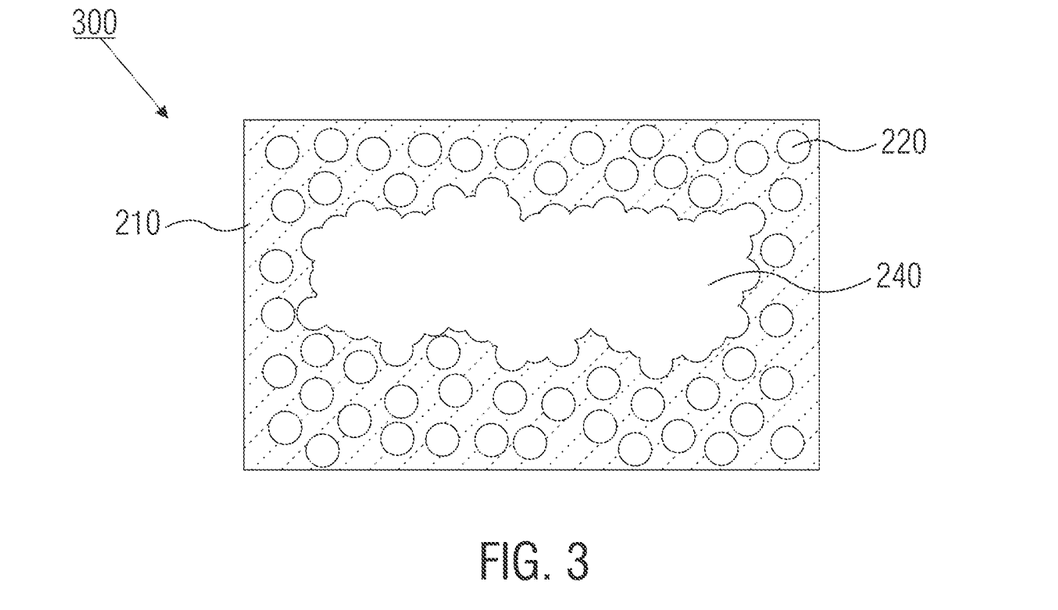
FIG. 3 shows a schematic illustration of an example carrier substrate with a conductive trace.

FIG. 3 shows a schematic cross section of a carrier substrate 300 for a semiconductor device according to an example. The carrier substrate 300 comprises conductive particles 220 embedded in an electrically insulating material layer 210. The carrier substrate 300 further comprises at least one conductive trace 240 of merged particles embedded in the electrically insulating material layer 210.

For example, the single conductive particle diameter is a natural lower limit for the width of the laser-written conductive structures (e.g. the conductive trace 240). For reliability reasons, it may be preferred to join more than 3 particles together. A lower limit for the trace width may be triple the single conductive particle diameter. For example, the minimal thickness, or smallest dimension, of the conductive trace may be greater than 3 (or greater than 5 or greater than 10) merged conductive particles.

The roughness of the contours of the conductive trace 240 may be the conductive particle diameter or slightly smaller than the conductive particle diameter, but the surface may still show unevenness in the range of the dimension of the conductive particles. In the most extreme case, a conductive particle 220 that touches the boundary of the conductive trace 240 on the edge of conductive particle 220 would be merged to it, contributing a boundary roughness to the conductive trace 240 equal to the diameter of the conductive particle 220. For example, the surface roughness of the conductive trace may be greater than 1 µm (or greater than 5 µm) and/or less than 50 µm (or less than 20 µm).

The carrier substrate may be a package substrate of a semiconductor device or a circuit board (e.g. PCB) for electrically connecting a semiconductor device to other components. The semiconductor device using the carrier substrate as package substrate or being attached to the circuit board (e.g. motherboard) formed by the carrier substrate may be a central processing unit CPU, a chipset, a graphics device, a wireless device, a multi-chip or 3D package including a CPU in combination with other devices, a memory device (e.g. flash device, DRAM device or SRAM device).

Optionally, the insulating material layer of the carrier substrate 300 comprises a first insulating material sublayer comprising a first conductive trace of merged particles and a second insulating material sublayer comprising a second conductive trace of merged particles.

The first insulating material sublayer and the second insulating material sublayer may be attached together with an anisotropic conductive adhesive such that the first conductive trace is electrically connected to the second conductive trace by the anisotropic conductive adhesive.

More details and aspects are mentioned in connection with the examples described above or below. The example shown in FIG. 3 may comprise one or more optional additional features corresponding to one or more aspects mentioned in connection with the proposed concept or one or more examples described above (e.g. FIGS. 1-2E) or below (e.g. FIGS. 4-6).

Figure 4:
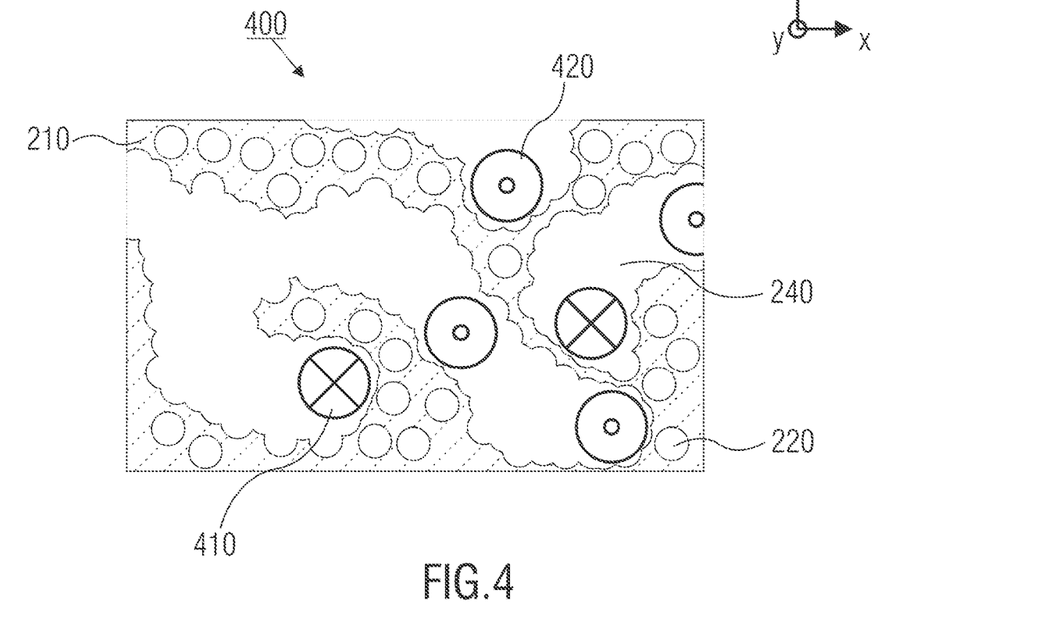
FIG. 4 shows a schematic illustration of an example carrier substrate with multiple conductive traces.

FIG. 4 shows a schematic cross section of a carrier substrate 400 for a semiconductor device according to an example. The carrier substrate 400 may be implemented similar to the carrier substrate described in connection with FIG. 3. The carrier substrate 400 contains numerous conductive traces 240, formed along and within the insulating material 210. Although FIG. 4 shows a cross-section of the substrate 400, the conductive traces are also written into 410 and out of 420 the shown plane. In other words, the conductive trace(s) 240 may be written in any three dimensional direction within the carrier substrate 400.

For example, FIG. 4 shows a cross-section through a dielectric material with suspended conductive particles with stealth written 3D traces (e.g. a stealth written block), with the arrow tail/head symbols indicating where traces run into and out of the shown plane.

More details and aspects are mentioned in connection with the examples described above or below. The example shown in FIG. 4 may comprise one or more optional additional features corresponding to one or more aspects mentioned in connection with the proposed concept or one or more examples described above (e.g. FIGS. 1-3) or below (e.g. FIGS. 5-7).

Figure 5:
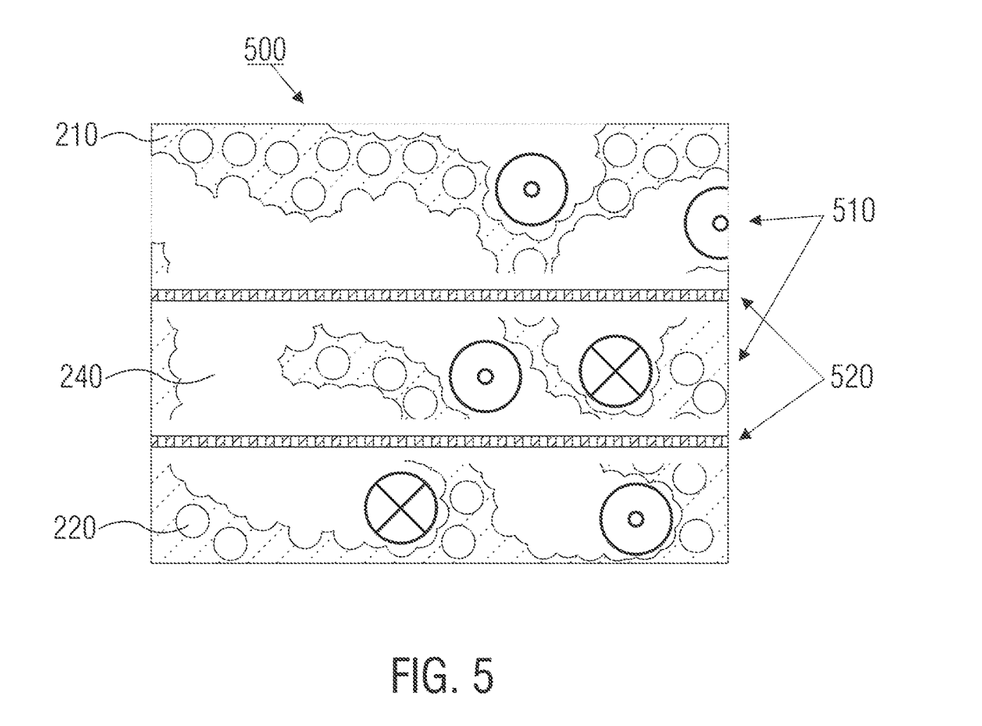
FIG. 5 shows a schematic illustration of an example carrier substrate formed using multiple layers.
Figure 6:
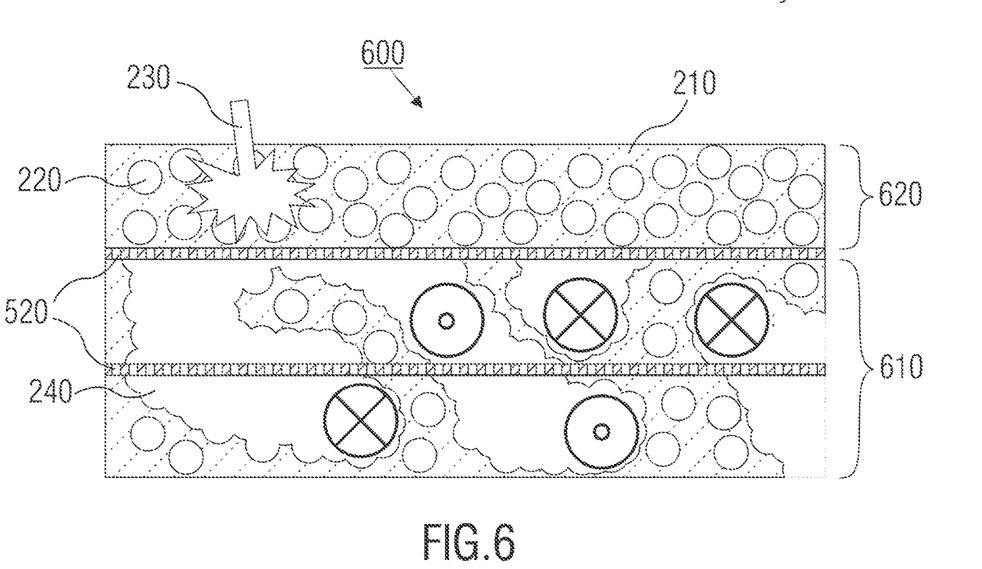
FIG. 6 shows a schematic illustration of another example carrier substrate formed using multiple layers.

Depending on the laser wave length and the absorption characteristics of the chosen material, the maximum possible writing depth at which the laser beam can be focused inside the material may vary. FIGS. 5 and 6 illustrate two variants of the process which require only a low writing depth by layer-wise buildup of a carrier substrate. In this way, conductive traces may be written into a substrate at a depth exceeding the maximum writing depth of the laser.

FIG. 5 shows a schematic cross section of a carrier substrate 500 for a semiconductor device during manufacturing according to an example. The carrier substrate 500 may be implemented similar to the carrier substrate described in connection with FIG. 1, but comprises multiple substrate sublayers. A variant of the process discussed above which requires only a low writing depth may be to join together several layers of separately written layers which are thinner than the maximum writing depth of the laser. For example, each layer may be written independently using the process discussed in relation to one or more of the FIGS. 1-4.

The carrier substrate 500 comprises multiple thin, separately written layers 510. The separately written layers 510 are attached together with bonding layers 520. The bonding layer 520 may comprise an anisotropic conductive adhesive and/or may result from the merging of particles between separately written layers 510 under application of appropriate pressure and heat.

For example, FIG. 5 shows if stealth writing is not possible through the whole material thickness, separate layers can be processed separately and bonded together afterwards (e.g. with an anisotropic conductive adhesive, by soldering, or through application of appropriate pressure and heat). Suitable types of dielectric material with suspended conductive particles may merge together without a bonding film, upon application of pressure and temperature. When soldering, care should be taken that the melting temperature of the conductive particles (or the temperature at which the insulating material degrades thermally) is above the solder reflow temperature so that the soldering process does not affect the resulting substrate. Design restrictions (e.g. a minimum required thickness of the traces or dielectric at the layer surface) or the additional bonding layers might lead to a substrate thickness increase as compared to stealth writing.

More details and aspects are mentioned in connection with the examples described above or below. The example shown in FIG. 4 may comprise one or more optional additional features corresponding to one or more aspects mentioned in connection with the proposed concept or one or more examples described above (e.g. FIGS. 1-4) or below (e.g. FIG. 6-7).

FIG. 6 shows a schematic cross section of a carrier substrate 600 for a semiconductor device during manufacturing according to an example. The carrier substrate 600 is similar to carrier substrate 500, except that the individual layers are not separately written before being attached together. The variant of the process shown in FIG. 6 is to write a thin layer, attach or form a raw (unwritten) layer on top (e.g. by depositing electrically insulating material with suspended conductive particles), and then to write that layer. This process may be repeated numerous times until the desired thickness is reached or the carrier substrate is complete.

The carrier substrate 600 comprises processed (written) layers 610, which are attached together in a manner analogous to the separately written layers 510 of FIG. 5. In other words, once a layer 610 is written, a raw 620 layer may be formed on it or attached to it by means of a bonding layer 520. The bonding layer may comprise an anisotropic conductive adhesive and/or may result from an appropriate application of pressure and temperature which merges the written 610 and unwritten 620 layers together. For example, the newly added raw layer 620 does not need to be aligned with the previously written 610 layer.

For example, FIG. 6 shows another option which is to attach or dispense a layer of raw material on the processed layers and only afterwards write the trace structure in the new layer. In other words, another variant may be to start with a thin sheet (so as to meet the writing depth capabilities of the laser being used), and after writing that sheet, add a thin enough layer of material (e.g. another thin sheet), write this next layer, again add material, and so on.

More details and aspects are mentioned in connection with the examples described above or below. The example shown in FIG. 6 may comprise one or more optional additional features corresponding to one or more aspects mentioned in connection with the proposed concept or one or more examples described above (e.g. FIGS. 1-5) or below (e.g. FIG. 7).

Possibilities for joining/adding layers are mentioned with respect to FIGS. 5 and 6 above. Via layers can be written separately or together with the RDL layers or could even be integrated in the bonding layers.

Figure 7:
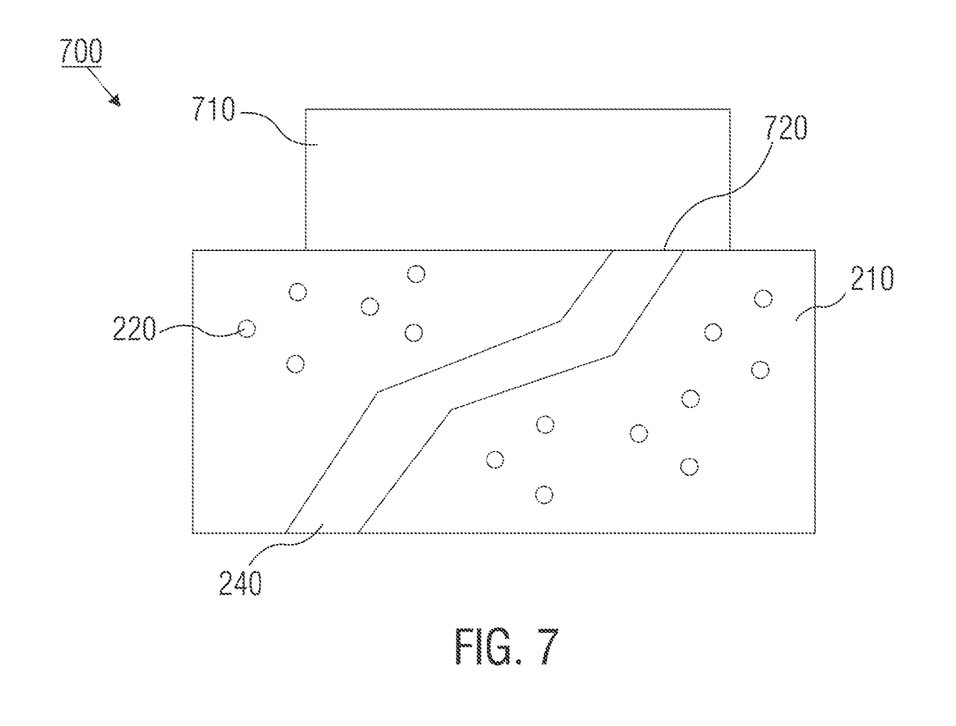
FIG. 7 shows a schematic cross-section of an example semiconductor device.

FIG. 7 shows a schematic cross section of a semiconductor device 700 according to an example. The semiconductor device 700 comprises a carrier substrate comprising conductive particles 220 embedded in an electrically insulating material layer 210 and a conductive trace 240 of merged conductive particles. The semiconductor device 700 further comprises a semiconductor die 710 electrically connected to the conductive trace 240.

For example, the semiconductor die 710 may be connected (e.g. soldered) to an exposed part of the conductive trace, or by electrically connecting the semiconductor die 710 to a contact pad 720 located on the carrier substrate and electrically connected to the conductive trace 240.

The carrier substrate of the semiconductor device 700 may be a carrier substrate as described in connection with one or more of the FIGS. 1-6.

More details and aspects are mentioned in connection with the examples described above or below. The example shown in FIG. 7 may comprise one or more optional additional features corresponding to one or more aspects mentioned in connection with the proposed concept or one or more examples described above (e.g. FIGS. 1-6) or below.

Some examples relate to 3D trace formation in dielectric material with conductive filler. Some build-up concepts of a substrate involve a multiple step sequence involving a variety of photo lithographic and chemical processing steps. In dielectric or insulating materials with suspended conductive particles, 3D conductive traces can be written in a single process act by a focused laser beam.

The conductive particles may be suspended in the dielectric material and may be isolated from each other. They can join together under simultaneous application of pressure and heat. A focused laser beam may generate very local heating so that under overall pressure, the conductive particles within the laser focus join together. A conductive trace may be formed by moving the laser focus progressively forward along the course of the desired trace.

Laser writing of conductive traces may be less complex and more flexible than other fabrication processes involving multiple steps (exposure, developing, etching, cleaning, plating, etc.). According to an aspect, a substrate technology is proposed which offers very flexible 3D trace manufacturing in a single production act.

In contrast to these other techniques, laser writing of conductive traces may involve:
  less steps, less equipment, and fewer materials and/or agents;
  may need no mask sets;
  design changes or variations may be easy to implement;
  may enable writing of 3D traces; for a dielectric material with suitable absorption characteristics and an appropriate laser wavelength, the laser focus can be moved to the inside of the material (similar to stealth dicing);
  may create vias in the same way as traces and does not separate dielectric and RDL (redistribution) layers which enable slimmer substrates;
  may limit line space as well as trace and via shapes and angles just by the laser focus and the conductive particle size;
  may allow for re-processing (e.g. traces can be added to correct design flaws).

The following examples are provided separately or in any combination:

Example 1 shows a method for forming a carrier substrate for a semiconductor device, the method comprising providing a substrate layer comprising conductive particles embedded in an electrically insulating material; and localized heating of the substrate layer along a desired trace by a laser to form a conductive trace of merged particles along the desired trace.

Example 2 may include the subject matter of Example 1, further comprising applying pressure greater than $10^{-10}$ bar and less than 100 bar to the substrate layer during the formation of the conductive trace.

Example 3 may include the subject matter of Example 2, wherein the pressure is applied by increasing the gas pressure of gas surrounding the substrate layer.

Example 4 may include the subject matter of any Examples 1-3, further comprising preheating regions of the desired trace to a temperature greater than the ambient temperature during the formation of the conductive trace.

Example 5 may include the subject matter of any of Examples 1-4, further comprising cooling of the substrate layer such that at least a part of the substrate layer has a temperature less than the ambient temperature during the formation of the conductive trace.

Example 6 may include the subject matter of any of Examples 1-5, wherein the conductive trace is formed along a surface of the substrate layer.

Example 7 may include the subject matter of any of Examples 1-6, wherein the conductive trace is formed into a depth of the substrate layer.

Example 8 may include the subject matter of any of Examples 1-7, wherein a wavelength of the laser is longer than 750 nm and shorter than 1 mm.

Example 9 may include the subject matter of any of Examples 1-8, wherein the laser is an infrared laser.

Example 10 may include the subject matter of any of Examples 1-9, wherein the laser emits pulses longer than 1 femtosecond and shorter than 1 picosecond.

Example 11 may include the subject matter of any of Examples 1-10, further comprising attaching a second substrate layer to the substrate layer, wherein the second substrate layer comprises conductive particles embedded in an electrically insulating material.

Example 12 may include the subject matter of Example 11, further comprising localized heating of the second substrate layer along a second desired trace by the laser to form a second conductive trace of merged particles along the second desired trace.

Example 13 may include the subject matter of any of Examples 11-12, wherein the substrate layer is attached to the second substrate layer by application of an anisotropic conductive adhesive.

Example 14 may include the subject matter of any of Examples 1-13, further comprising forming a contact pad on a part of the conductive trace uncovered at a surface of the substrate layer.

Example 15 may include the subject matter of Example 14, further comprising uncovering the part of the conductive trace by removing a part of the electrically insulating material before forming the contact pad.

Example 16 may include the subject matter of Example 14, further comprising covering at least a part of the conductive trace by adding a part to the electrically insulating material before or during forming of the contact pad.

Example 17 may include the subject matter of any of Examples 1-16, further comprising electrically connecting a semiconductor die to the conductive trace.

Example 18 may include the subject matter of any of Examples 1-17, wherein the carrier substrate is a package substrate of the semiconductor device or a circuit board for electrically connecting a semiconductor device to other components.

Example 19 may include the subject matter of any of Examples 1-18, wherein the electrically insulating material comprises at least one of a mold compound, gel type content, and resin.

Example 20 may include the subject matter of any of Examples 1-19, wherein the conductive particles are solder, tin particles, tin alloy particles, lead particles, lead alloy particles, nickel particles, nickel alloy particles, copper particles, copper alloy particles, silver particles, silver alloy particles, aluminum particles, aluminum alloy particles, gold particles, or gold alloy particles.

Example 21 shows a carrier substrate for a semiconductor device, the carrier substrate comprising conductive particles embedded in an electrically insulating material layer; and at least one conductive trace of merged particles embedded in the electrically insulating material layer.

Example 22 may include the subject matter of Example 21, wherein the electrically insulating material layer comprises at least one of a mold compound, gel type content, and resin, Example 23 may include the subject matter of any of Examples 21-22, wherein the conductive particles are solder, tin particles, tin alloy particles, lead particles, lead alloy particles, nickel particles, nickel alloy particles, copper particles, copper alloy particles, silver particles, silver alloy particles, aluminum particles, aluminum alloy particles, gold particles, or gold alloy particles.

Example 24 may include the subject matter of any of Examples 21-23, wherein a surface roughness of the conductive trace is greater than 1 µm.

Example 25 may include the subject matter of any of Examples 21-24, wherein a minimal thickness of the conductive trace is greater than 3 merged conductive particles.

Example 26 may include the subject matter of any of Examples 21-25, wherein the insulating material layer comprises a first insulating material sublayer comprising a first conductive trace of merged particles and a second insulating material sublayer comprising a second conductive trace of merged particles.

Example 27 may include the subject matter of Example 26, wherein the first insulating material sublayer and the second insulating material sublayer are attached together with an anisotropic conductive adhesive such that the first conductive trace is electrically connected to the second conductive trace by the anisotropic conductive adhesive.

Example 28 may include the subject matter of any of Examples 21-27, wherein an average density of the embedded conductive particles is greater than $1*10^4$ particles per $mm^3$ and less than $2\times10^9$ particles per $mm^3$.

Example 29 may include the subject matter of any of Examples 21-28, wherein an average size of the embedded conductive particles is greater than 1 µm and less than 50 µm.

Example 30 may include the subject matter of any of Examples 21-29, wherein an average center-to-center distance between the embedded conductive particles is greater than an average particle diameter and less than double the average particle diameter.

Example 31 may include the subject matter of any of Examples 21-30, wherein an average boundary-to-boundary distance between the embedded conductive particles is greater than 0 and less than an average particle diameter.

Example 32 may include the subject matter of any of Examples 21-31, wherein the carrier substrate is a package substrate for a semiconductor device or a circuit board for electrically connecting a semiconductor device to other components.

Example 33 shows a semiconductor device comprising a carrier substrate comprising conductive particles embedded in an electrically insulating material layer and a conductive trace of merged conductive particles; and a semiconductor die electrically connected to the conductive trace.

Example 34 may include the subject matter of Example 33, wherein the carrier substrate is a package substrate of the semiconductor device or a circuit board for electrically connecting a semiconductor device to other components.

Example 35 shows a non-transitory computer readable medium containing computer code that, when executed, performs the method of any of Examples 1-20.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for forming a carrier substrate for a semiconductor device, the method comprising:
    providing a substrate layer with at least a first area, the first area comprising conductive particles embedded in an electrically insulating material; and
    localized heating of the first area along a desired trace by a laser to form a conductive trace of merged particles along the desired trace wherein a remainder of the first area that is not subjected to the localized heating remains electrically insulating.

2. The method of claim 1, further comprising applying pressure greater than $1*10^{-10}$ bar and less than 100 bar to the substrate layer during the formation of the conductive trace.

3. The method of claim 2, wherein the pressure is applied by increasing the gas pressure of gas surrounding the substrate layer.

4. The method of claim 1, further comprising pre-heating regions of the desired trace to a temperature greater than the ambient temperature during the formation of the conductive trace.

5. The method of claim 1, further comprising cooling of the substrate layer such that at least a part of the substrate layer has a temperature less than ambient temperature during the formation of the conductive trace.

6. The method of claim 1, wherein the conductive trace is formed along a surface of the substrate layer.

7. The method of claim 1, wherein the conductive trace is formed into a depth of the substrate layer.

8. The method of claim 1, wherein a wavelength of the laser is longer than 750 nm and shorter than 1 mm.

9. The method of claim 1, wherein the laser is an infrared laser.

10. The method of claim 1, wherein the laser emits pulses longer than 1 femtosecond and shorter than 1 picosecond.

11. The method of claim 1, further comprising attaching a second substrate layer to the substrate layer, wherein the second substrate layer comprises conductive particles embedded in an electrically insulating material.

12. The method of claim 11, further comprising localized heating of the second substrate layer along a second desired trace by the laser to form a second conductive trace of merged particles along the second desired trace.

13. The method of claim 11, wherein the substrate layer is attached to the second substrate layer by application of an anisotropic conductive adhesive.

14. The method of claim 1, further comprising forming a contact pad on a part of the conductive trace uncovered at a surface of the substrate layer.

15. The method of claim 14, further comprising uncovering the part of the conductive trace by removing a part of the electrically insulating material before forming the contact pad.

16. The method of claim 1, further comprising electrically connecting a semiconductor die to the conductive trace.

17. The method of claim 16, wherein the carrier substrate is a package substrate of the semiconductor device or a circuit board for electrically connecting a semiconductor device to other components.

18. The method of claim 1, wherein the electrically insulating material comprises at least one of a mold compound, gel type content, and resin.

19. The method of claim 1, wherein the conductive particles are solder, tin particles, tin alloy particles, lead particles, lead alloy particles, nickel particles, nickel alloy particles, copper particles, copper alloy particles, silver particles, silver alloy particles, aluminum particles, aluminum alloy particles, gold particles, or gold alloy particles.

* * * * *